(12) United States Patent
Schaller et al.

(10) Patent No.: US 12,210,706 B2
(45) Date of Patent: Jan. 28, 2025

(54) ULTRASONIC TOUCH SENSOR

(71) Applicant: Infineon Technologies AG, Neubiberg (DE)

(72) Inventors: Rainer Markus Schaller, Saal an der Donau (DE); Jochen Dangelmaier, Beratzhausen (DE); Klaus Elian, Alteglofsheim (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 210 days.

(21) Appl. No.: 17/850,026

(22) Filed: Jun. 27, 2022

(65) Prior Publication Data

US 2023/0010130 A1 Jan. 12, 2023

(30) Foreign Application Priority Data

Jul. 6, 2021 (DE) .......................... 102021117383.3

(51) Int. Cl.
*G06F 3/043* (2006.01)
*G01N 29/22* (2006.01)
(Continued)

(52) U.S. Cl.
CPC ............. *G06F 3/043* (2013.01); *G01N 29/22* (2013.01); *G01N 29/222* (2013.01);
(Continued)

(58) Field of Classification Search
CPC ...... G06F 3/043; G06F 1/1671; G06F 3/0436; G01N 29/22; G01N 29/222; G01N 29/223; H03K 17/96
See application file for complete search history.

(56) References Cited

U.S. PATENT DOCUMENTS

2004/0246239 A1* 12/2004 Knowles ................ H01H 13/83
345/173
2015/0164471 A1* 6/2015 Morgan ............... A61B 8/4281
600/472

(Continued)

FOREIGN PATENT DOCUMENTS

DE 102017202672 A1 8/2018
EP 3575934 A1 * 12/2019 ............. G06F 3/017
KR 20100118681 A * 4/2009 ............. H03K 17/96

OTHER PUBLICATIONS

Prokop et al. "Polyacrylamide gel as an acoustic coupling medium for focused ultrasound therapy," Apr. 2003. Available online at https://www.sciencedirect.com/science/article/pii/S0301562903009797 (Year: 2003).*

*Primary Examiner* — Benjamin R Schmitt
(74) *Attorney, Agent, or Firm* — Harrity & Harrity, LLP (57) ABSTRACT

An ultrasonic touch sensor is proposed for attachment to a casing, having a semiconductor chip including a substrate side and a component side, the semiconductor chip including an ultrasonic transducer element and the ultrasonic transducer element being arranged on the component side, having an acoustic coupling medium covering the semiconductor chip at least in the region of the ultrasonic transducer element, having electrical contact elements for controlling the ultrasonic transducer element, and the electrical contact elements being arranged on the component side of the semiconductor chip.

26 Claims, 9 Drawing Sheets

(51) Int. Cl.
*G06F 1/16* (2006.01)
*H03K 17/96* (2006.01)
(52) U.S. Cl.
CPC ......... *G01N 29/223* (2013.01); *G06F 1/1671* (2013.01); *G06F 3/0436* (2013.01); *H03K 17/96* (2013.01)

(56) References Cited

U.S. PATENT DOCUMENTS

2019/0354210 A1 11/2019 Akhbari et al.
2020/0413202 A1 12/2020 Kusano et al.

* cited by examiner

ULTRASONIC TOUCH SENSOR

RELATED APPLICATION

This application claims priority to German Patent Application No. 102021117383.3, filed on Jul. 6, 2021, which is incorporated herein by reference in its entirety.

BACKGROUND

Many applications require a user to interact with an electronic system. For example, a motor vehicle requires a switch to operate the windscreen ventilation and an appropriate display. Touch sensors are often used as switches. Capacitive touch sensors are subject to restrictions regarding the material of the surface on which they are designed to detect contact. For example, a combination of a metal contact surface with a capacitive touch sensor is not normally possible. In the case of ultrasonic touch sensors, the contact surface may consist of different materials. However, a good acoustic coupling to the contact surface is necessary in order to be able to reliably detect a touch.

From this point of view, an object of the embodiments of the present disclosure is to provide an ultrasonic touch sensor that can be easily attached to a casing.

SUMMARY

The object can be achieved with the subject-matter of the main claim. Advantageous embodiments are specified in the dependent claims.

An ultrasonic touch sensor is proposed for attachment to a casing, having a semiconductor chip including a substrate side and a component side, the semiconductor chip including an ultrasonic transducer element and the ultrasonic transducer element being arranged on the component side, having an acoustic coupling medium covering the semiconductor chip at least in the region of the ultrasonic transducer element, having electrical contact elements for controlling the ultrasonic transducer element, and the electrical contact elements being arranged on the component side of the semiconductor chip.

BRIEF DESCRIPTION OF THE DRAWINGS

Examples of the proposed ultrasonic touch sensor will now be explained in more detail using the drawing. In the drawings.

DETAILED DESCRIPTION

Figure 1:
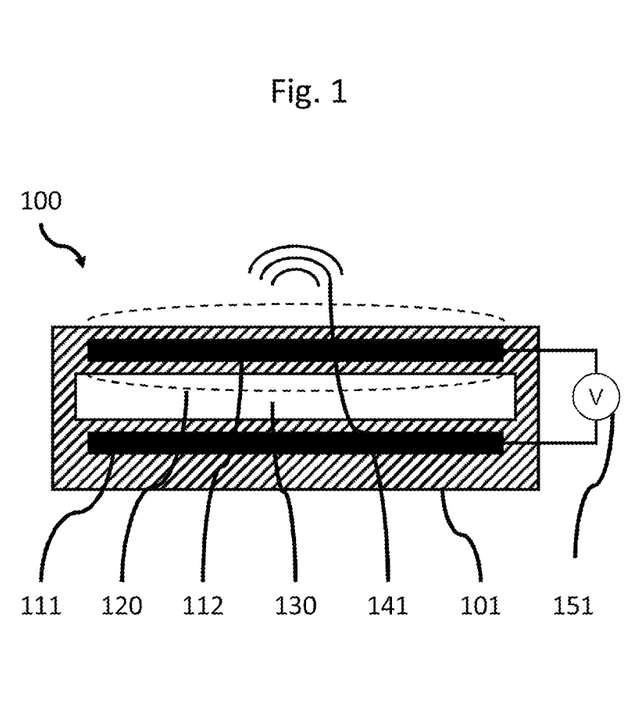
FIG. 1 shows an ultrasonic transceiver.
Figure 2:
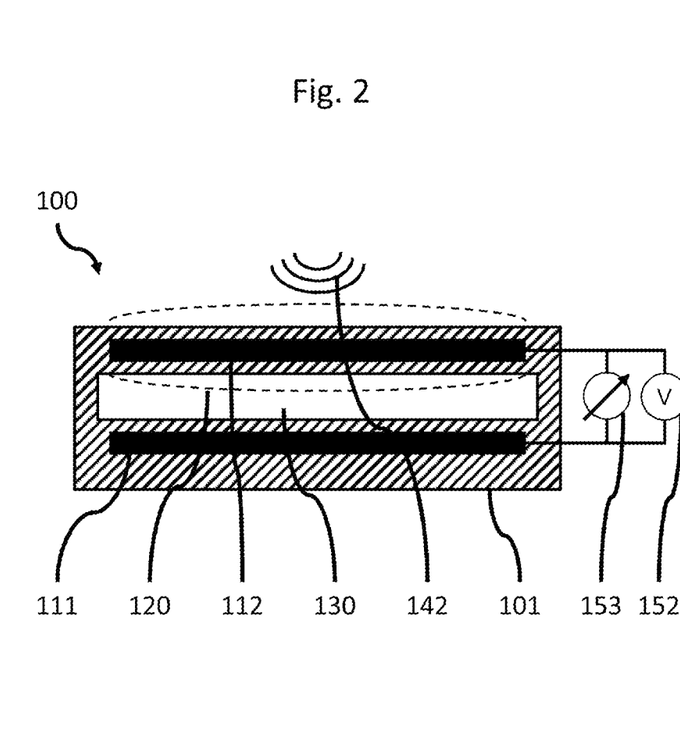
FIG. 2 shows an ultrasonic transceiver.

FIGS. 1 and 2 show an ultrasonic transducer element 100. The ultrasonic transducer element 100 has a diaphragm 120 with an electrode 112 and a substrate 101 with an electrode 111. Between the diaphragm 120 and the substrate 101, a cavity 130 is provided, which allows the diaphragm 120 to move.

By applying an alternating voltage between the electrodes 111 and 112 using a voltage source 151, the diaphragm 120 can be excited into vibration so that the ultrasonic transducer element 100 can emit ultrasonic waves 141.

The ultrasonic transducer element 100 shown in FIGS. 1 and 2 can also be used to detect ultrasonic waves 142. For this purpose, a DC voltage can be applied between the electrodes 111 and 112 using the voltage source 152. The ultrasonic waves 142 can stimulate the diaphragm 120 into vibration. Due to the resulting varying distance between electrodes 111 and 112, an alternating voltage is induced which can be measured with a measuring device 153.

FIGS. 3 to 6 show schematically how an ultrasonic transducer element 311 or 411 can be used to detect contact with a casing 390, 490 on the side of the casing 390, 490 opposite the ultrasonic touch sensor. The ultrasonic transducer element 311 or 411 is embedded in an encapsulation layer 320, 420, wherein the encapsulation layer 320, 420 has a contact surface with which the ultrasonic touch sensor is attached to the casing 390, 490. The ultrasonic transducer element 311, 411 can be mounted on a printed circuit board 370, 470 and electrically connected to it.

Figure 3:
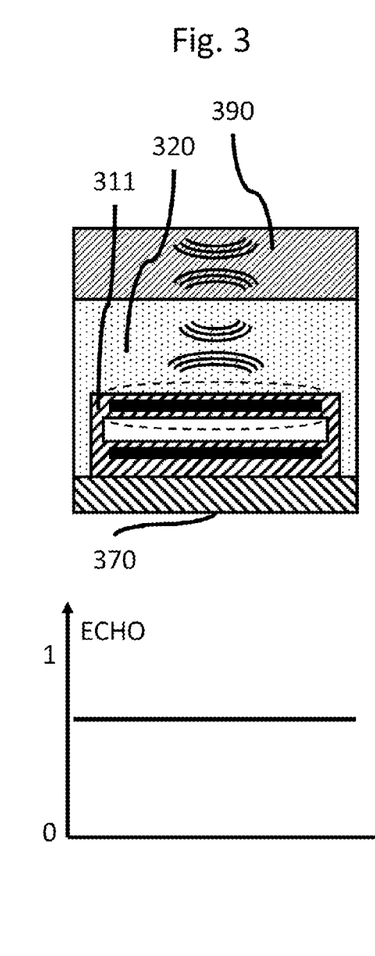
FIG. 3 shows an ultrasonic transceiver in a first situation.

As shown in FIG. 3, the ultrasonic transducer element 311 can be used to generate ultrasonic waves which are transmitted essentially completely through the interface between the encapsulation layer 320 and the casing 390 and then reflected at the free surface of the casing 390, located opposite the encapsulation layer 320. After the repeated transmission through the interface between the casing 390 and the encapsulation layer 320, the ultrasonic waves can be detected by the sensor element 311 again so that an echo signal is obtained, as shown under FIG. 3.

Figure 4:
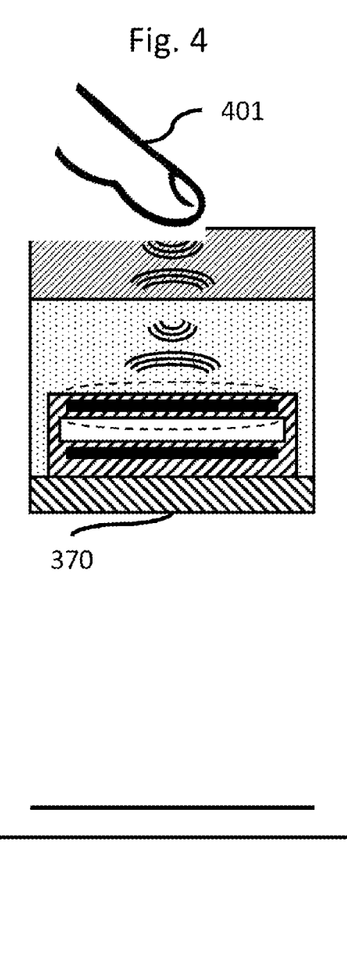
FIG. 4 shows the ultrasonic transceiver shown in FIG. 3 in a second situation.

When contact is made with the free surface of the casing 390 opposite the encapsulation layer 320, for example with a finger 401, only a small component of the ultrasonic waves is reflected at the free surface and the echo signal decreases, as shown under FIG. 4.

Figure 5:
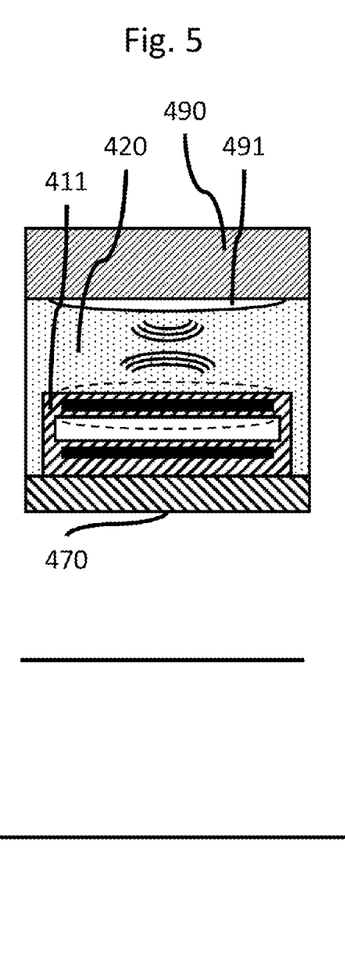
FIG. 5 shows an ultrasonic transceiver in a third situation.

FIG. 5 shows that when the ultrasonic touch sensor is mounted on the casing 490, a cavity 491 remains. As a result of this cavity 491 the ultrasonic waves emitted by the sensor element 411 do not pass through the interface between the encapsulation layer 420 and the casing 490, but are reflected at this interface with the result that an echo signal, as shown below it, is obtained.

Figure 6:
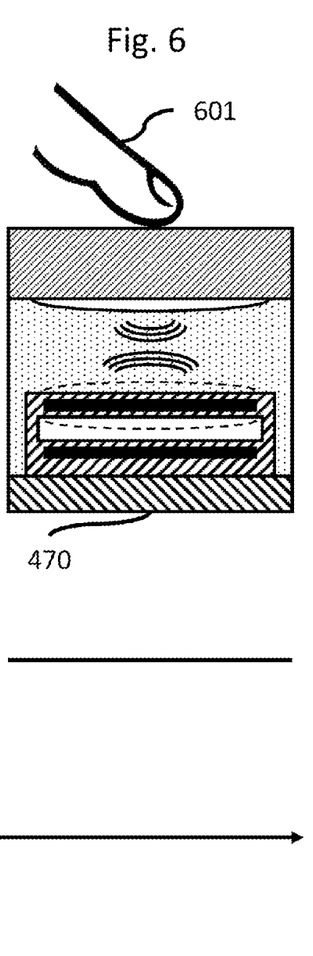
FIG. 6 shows the ultrasonic transceiver shown in FIG. 5 in a fourth situation.

Since the ultrasonic waves are not (or not quite) transmitted into the casing, touching the casing 490 with the finger 601 does not cause a change in the echo signal.

Figure 7:
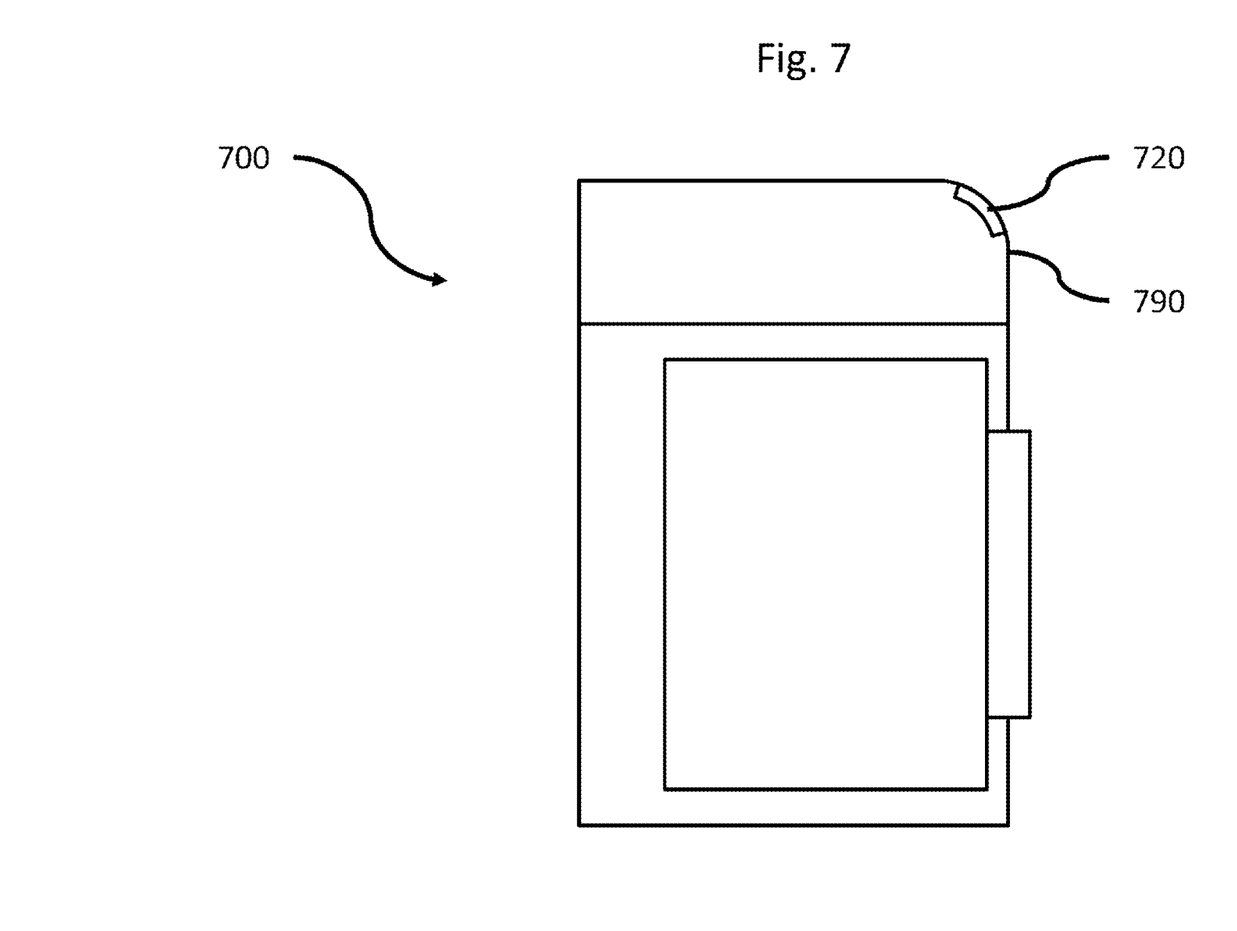
FIG. 7 shows a household appliance.

FIG. 7 shows an example of the use of the proposed ultrasonic touch sensor 720 in a household appliance 700. The household appliance 700 can be a washing machine, for example. On a casing 790 of the household appliance 700, an ultrasonic touch sensor 720 is provided which can be used to change or check the settings of the household appliance 700. Compared to other touch sensors, an ultrasonic touch sensor can have the advantage that it can also be used for casings made of metal.

Figure 8:
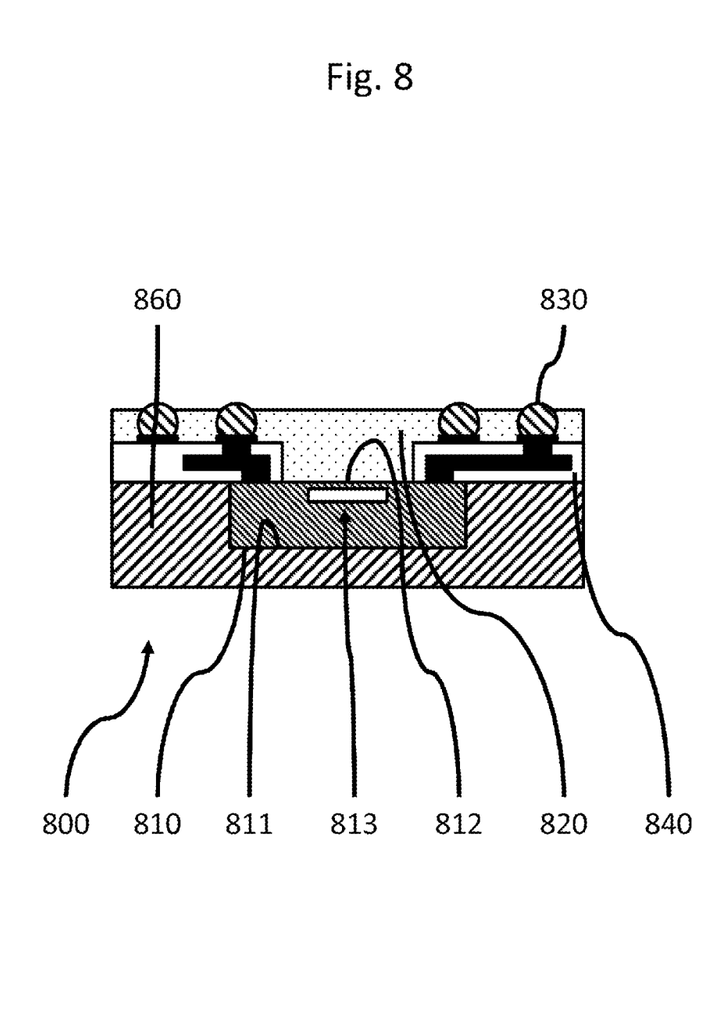
FIG. 8 shows an ultrasonic touch sensor.

FIG. 8 shows an ultrasonic touch sensor 800 for attaching to a casing. The ultrasonic touch sensor 800 has a semiconductor chip 810 with an ultrasonic transducer element 813, an acoustic coupling medium 820, and electrical contact elements 830. In the example shown in FIG. 8, the electrical contact elements 830 are provided in the form of a ball grid array. The electrical contact elements 830 can comprise solder balls, in particular. By melting on and/or melting to the solder balls, the ultrasonic touch sensor 800 can be easily attached to the casing. However, as will be described below, other forms of electrical contact elements 830 are also conceivable. The semiconductor chip 810 has a substrate side 811 and a component side 812. The ultrasonic transducer element 813 is arranged on the component side of the semiconductor chip 810. The acoustic coupling medium 820 covers the semiconductor chip 810 at least in the region of the ultrasonic transducer element 813. The contact elements 830 for controlling the ultrasonic transducer element 813 are arranged on the component side 812 of the semiconductor chip 810. The provision of the electrical contact elements 830 on the same side as the active side of the ultrasonic transducer element 813 can simplify the attachment of the ultrasonic touch sensor 800 to the casing and its electrical connection. In addition to the ultrasonic transducer element 813, the semiconductor chip 810 can also feature other sensor elements, evaluation elements, amplifiers, active circuit elements and/or passive circuit elements.

In the example of FIG. 8, the semiconductor chip 810 is arranged on a carrier 860, and an intermediate connecting layer 840 is provided to electrically connect the electrical terminals of the semiconductor chip 810 to the individual electrical contact elements 830. The carrier 860 can have the advantage that the ultrasonic sensor 800 is easier to handle mechanically and can be more easily attached to a casing. The acoustic coupling medium 820 can be applied before the electrical contact elements 830 and/or the intermediate connecting layer 840 are attached (pre-applied underfill). This can make it possible to provide the acoustic coupling medium between the electrical contact elements 830, even with a very small spacing of the electrical contact elements 830. It is also conceivable to attach the acoustic coupling medium only after attaching the electrical contact elements. This can simplify the manufacturing process. In particular, the acoustic coupling medium may comprise a gel.

Figure 9:
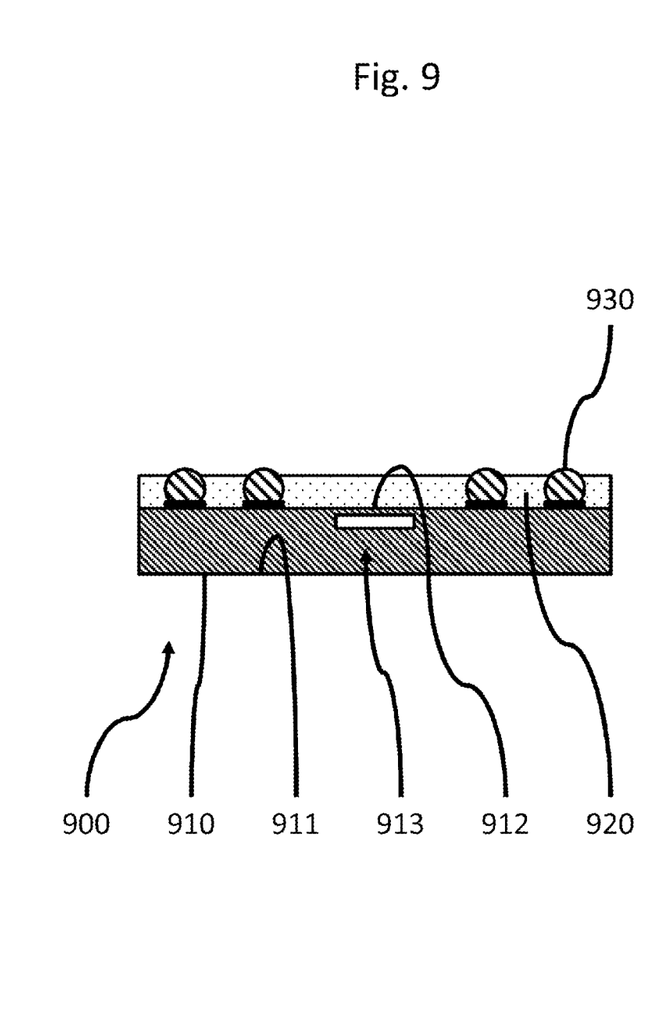
FIG. 9 shows an ultrasonic touch sensor.

FIG. 9 shows another ultrasonic touch sensor 900 for attachment to a casing, having a semiconductor chip 910 comprising a substrate side 911 and a component side 912, the semiconductor chip 910 comprising an ultrasonic transducer element 913, and the ultrasonic transducer element 913 being arranged on the component side 912, having an acoustic coupling medium 920 covering the semiconductor chip 910 at least in the region of the ultrasonic transducer element 913, having electrical contact elements 930 for controlling the ultrasonic transducer element 913, and the electrical contact elements 930 being arranged on the component side 912 of the semiconductor chip 910. In contrast to the example shown in FIG. 8, the ultrasonic touch sensor 900 has neither a carrier nor an intermediate connecting layer.

Figure 10:
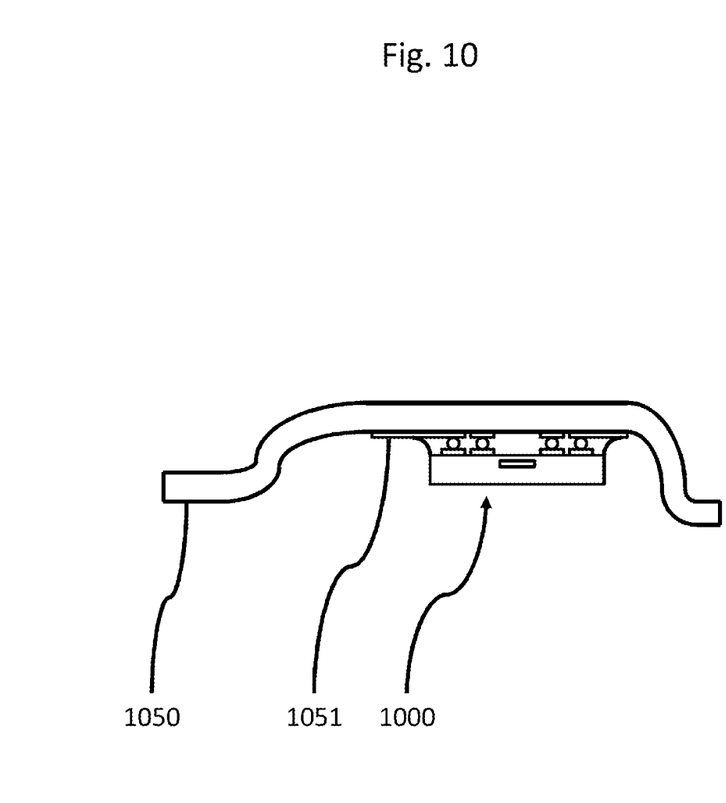
FIG. 10 shows a casing with an ultrasonic touch sensor.

FIG. 10 shows an ultrasonic touch sensor 1000 mounted on a casing 1050. The casing 1050 has a metallic coating 1051 on the side facing the ultrasonic touch sensor 1000. The metallic coating 1051 can enable the electrical connection of the casing 1050 to the ultrasonic touch sensor 1000. In particular, the metallic coating 1051 can be designed in the form of conductor tracks.

Figure 11:
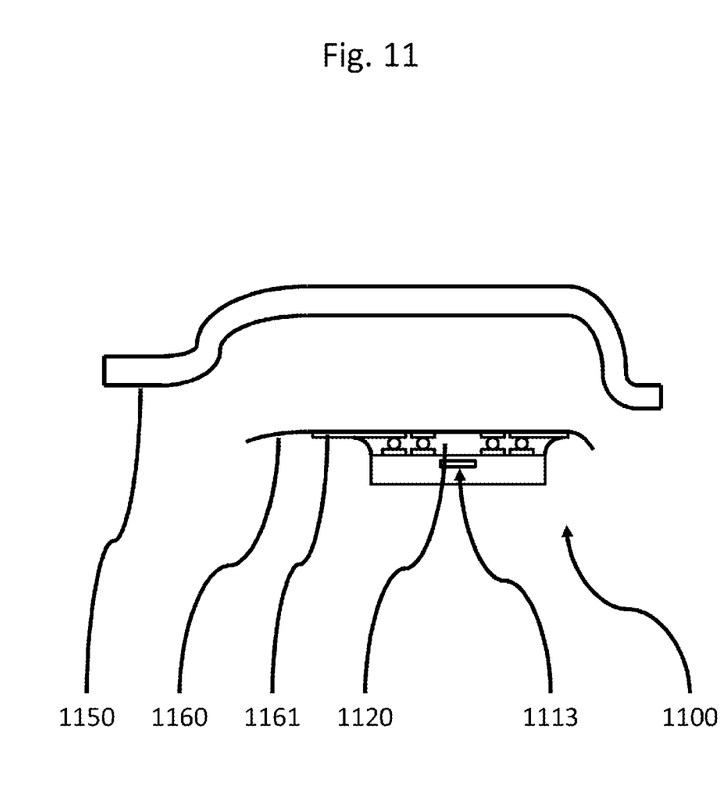
FIG. 11 shows a casing with an ultrasonic touch sensor.

The ultrasonic touch sensor 1100 shown in FIG. 11 has a flexible substrate 1160 and the acoustic coupling medium 1120 is arranged between the ultrasonic transducer element 1113 and the flexible substrate 1160. The flexible substrate 1160 can provide conductor tracks 1161 for the electrical control of the ultrasonic transducer element 1113. On the side opposite the coupling medium 1120, the flexible substrate 1160 can have an adhesive layer (not shown), with which the ultrasonic touch sensor 1100 can be bonded to the casing 1150.

Figure 12:
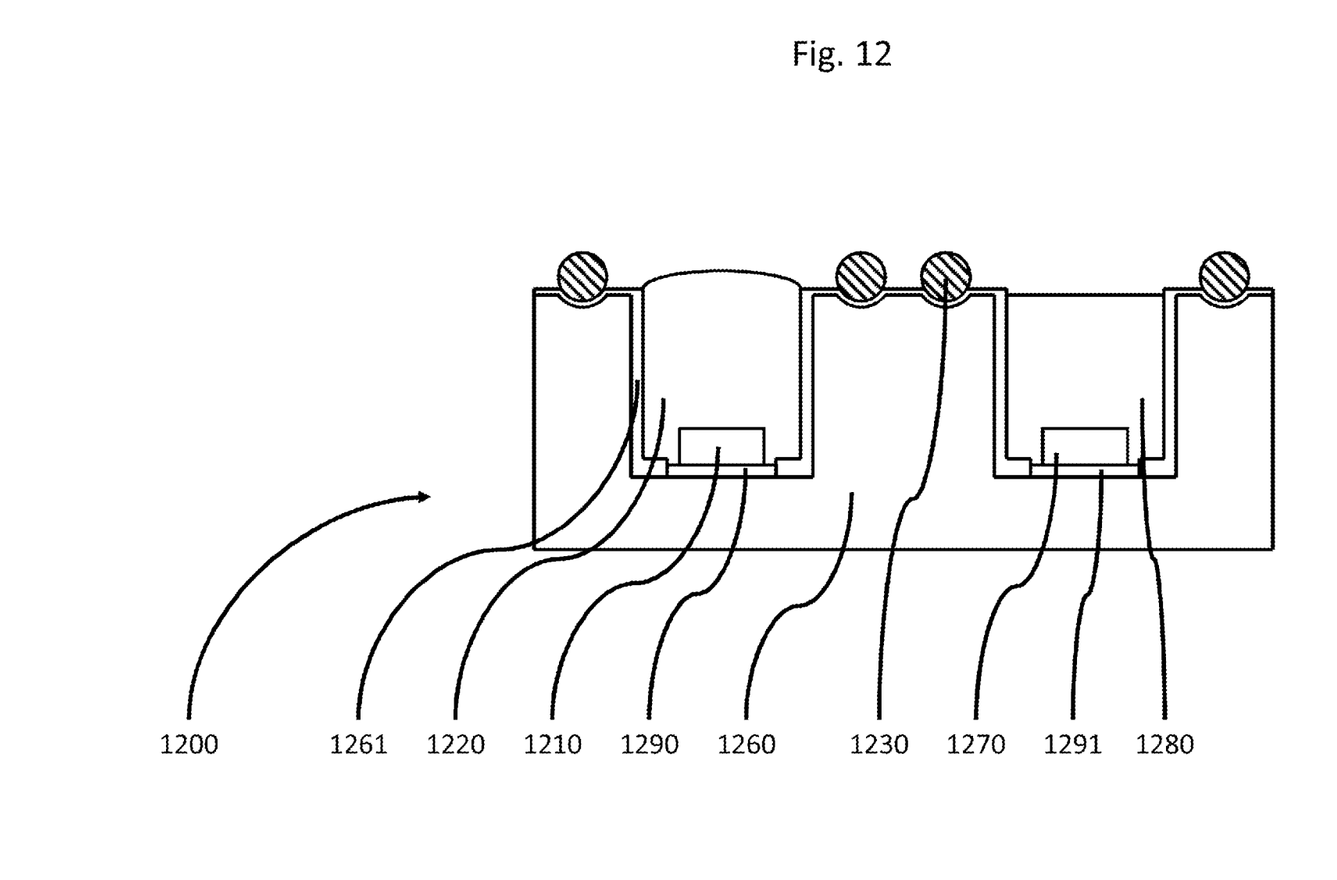
FIG. 12 shows an ultrasonic touch sensor.

FIG. 12 shows an ultrasonic touch sensor 1200 which comprises a pre-assembled housing 1260. The semiconductor chip 1210 with the ultrasonic transducer element is arranged in a trough of the pre-assembled housing 1260. The semiconductor chip 1210 can be fixed in the trough by means of an adhesive layer 1290. The trough can be filled with the acoustic coupling medium 1220. The housing 1260 can have a higher stiffness than the acoustic coupling medium 1220. As indicated in FIG. 12, the acoustic coupling medium can protrude slightly over the trough, so that when the ultrasonic touch sensor 1200 is attached to a casing the coupling medium is provided continuously between the ultrasonic touch sensor 1200 and the casing. It is also conceivable that the housing 1260 has a lower stiffness than the acoustic coupling medium 1220 so that it yields when the ultrasonic touch sensor 1200 is attached to the casing, so that the acoustic coupling medium 1220 is arranged between the ultrasonic transducer element and the casing under slight pressure due to the elasticity of the housing 1260, and a good acoustic coupling can be achieved. Within the trough of the pre-assembled housing 1260, conductor tracks 1261 can be provided for the electrical connection of the semiconductor chip 1210 to the electrical contact elements 1230 of the ultrasonic touch sensor 1200. In the ultrasonic touch sensor 1200 shown in FIG. 12 the electrical contact elements 1230 can be solder balls. The ultrasonic touch sensor 1200 can have another semiconductor chip 1270, which can be mounted in a further trough of the housing by means of an adhesive layer 1291. The second trough can then be potted with an encapsulation material 1280. The second semiconductor chip can provide, for example, an integrated circuit with an evaluation circuit for the ultrasonic touch sensor 1210.

Figure 13:
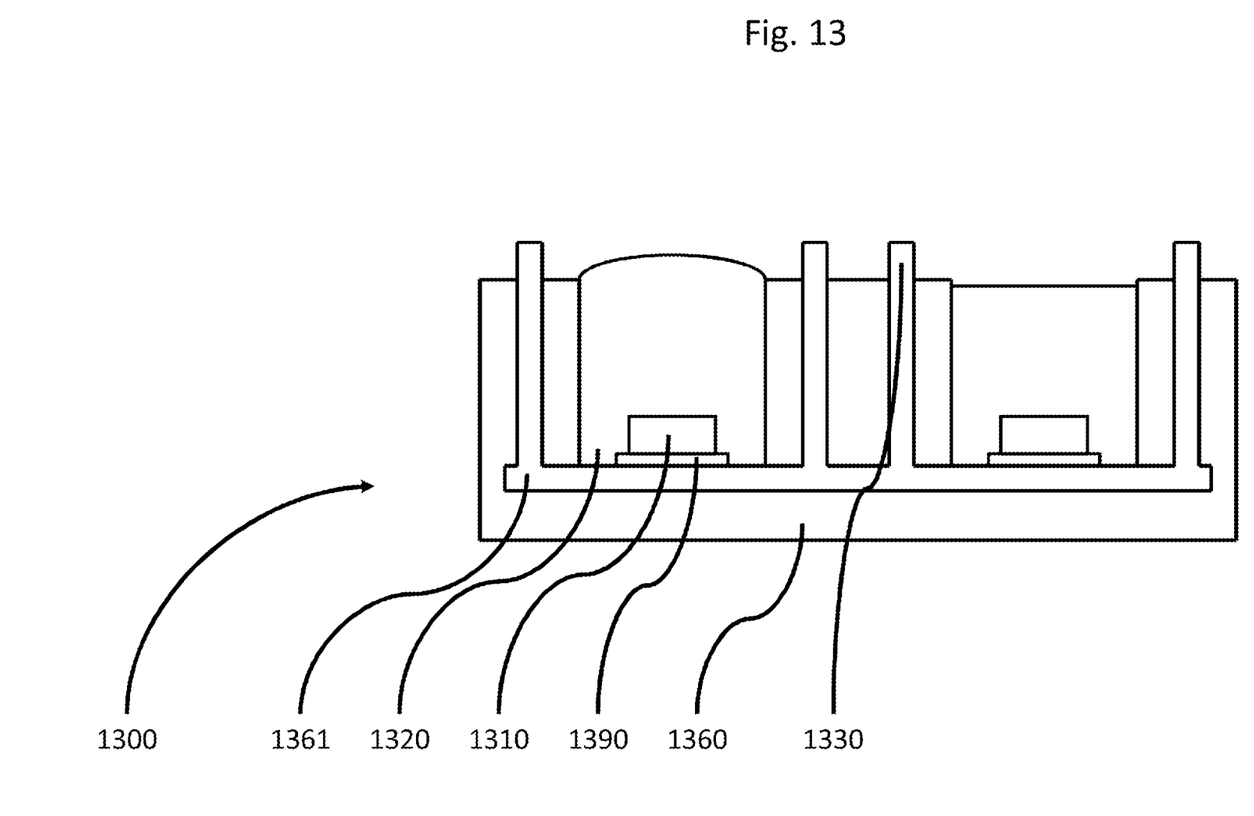
FIG. 13 shows an ultrasonic touch sensor.

FIG. 13 also shows an ultrasonic touch sensor 1300 which has a pre-assembled housing 1360. A semiconductor chip 1310 with an ultrasonic transducer element (not shown) is fixed in a trough of the pre-assembled housing 1360 by means of an adhesive layer 1390. The pre-assembled housing 1360 has an encapsulated conductor track 1361 for the electrical connection of the semiconductor chip 1310 to the contact element 1330. The conductor track 1361 can be part of a lead frame. The trough of the pre-assembled housing is filled with an acoustic coupling medium 1320.

Figure 14:
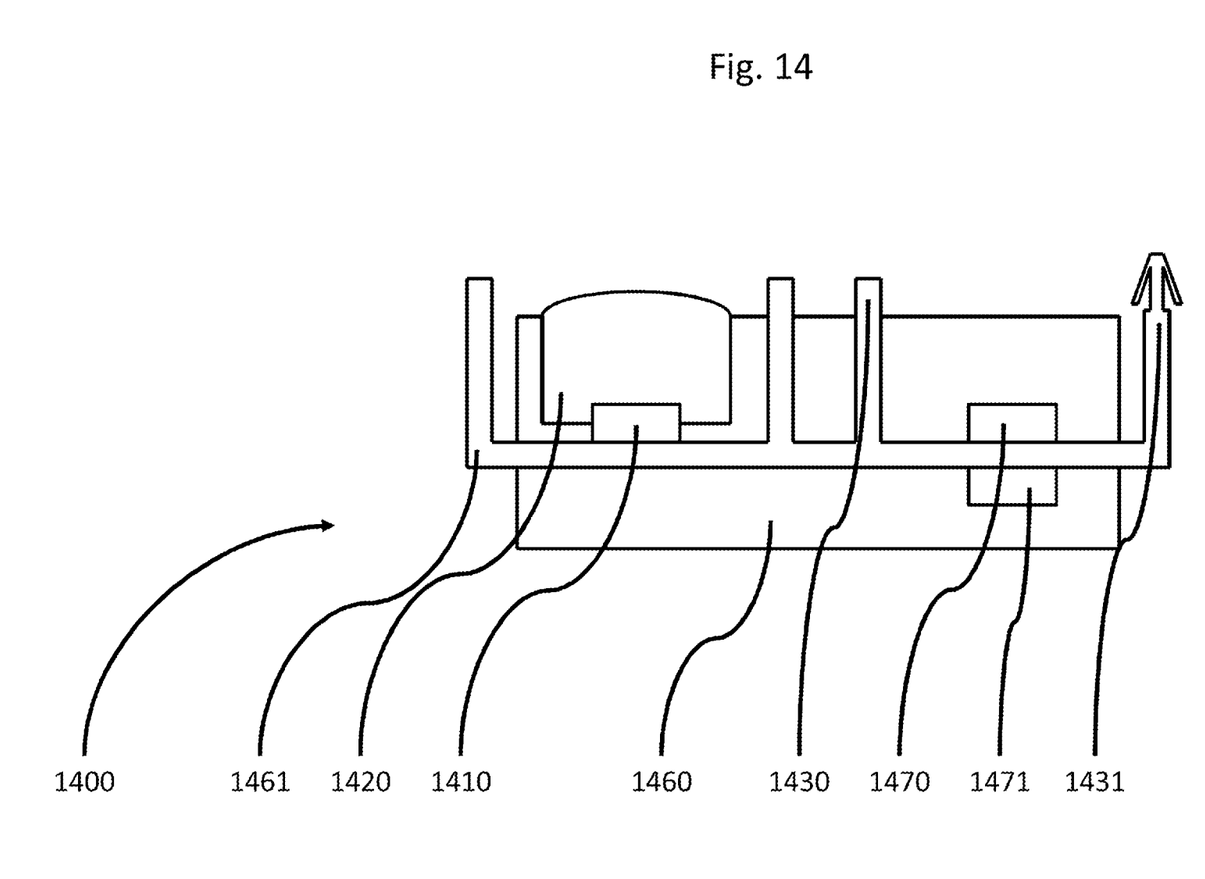
FIG. 14 shows an ultrasonic touch sensor.

In the ultrasonic touch sensor 1400 shown in FIG. 14, the semiconductor chip 1410 with the ultrasonic transducer element is arranged in an enclosure 1460. A conductor track 1461, which electrically connects the semiconductor chip 1410 to the electrical contact element 1430, is potted in the enclosure 1460. The conductor track 1461 can be part of a lead frame. An acoustic coupling medium 1420 is provided above the semiconductor chip 1410. At least one electrical contact element can be implemented as a spring pin 1431. This spring pin can simplify the mechanical attachment of the ultrasonic touch sensor 1400 to the casing. It is conceivable that only a part of the electrical contact elements should be formed as spring pins and that solder balls should be provided as further electrical contact elements. In this way, the mechanical advantages of the spring pins can be combined with the electrical advantages of the solder balls. On both sides of the conductor track 1461 or an additional conductor track, further semiconductor chips 1470, 1471 can be provided and potted with one of the encapsulations, which can be used to implement further functions of the ultrasonic-wave contact sensor 1400.

Figure 15:
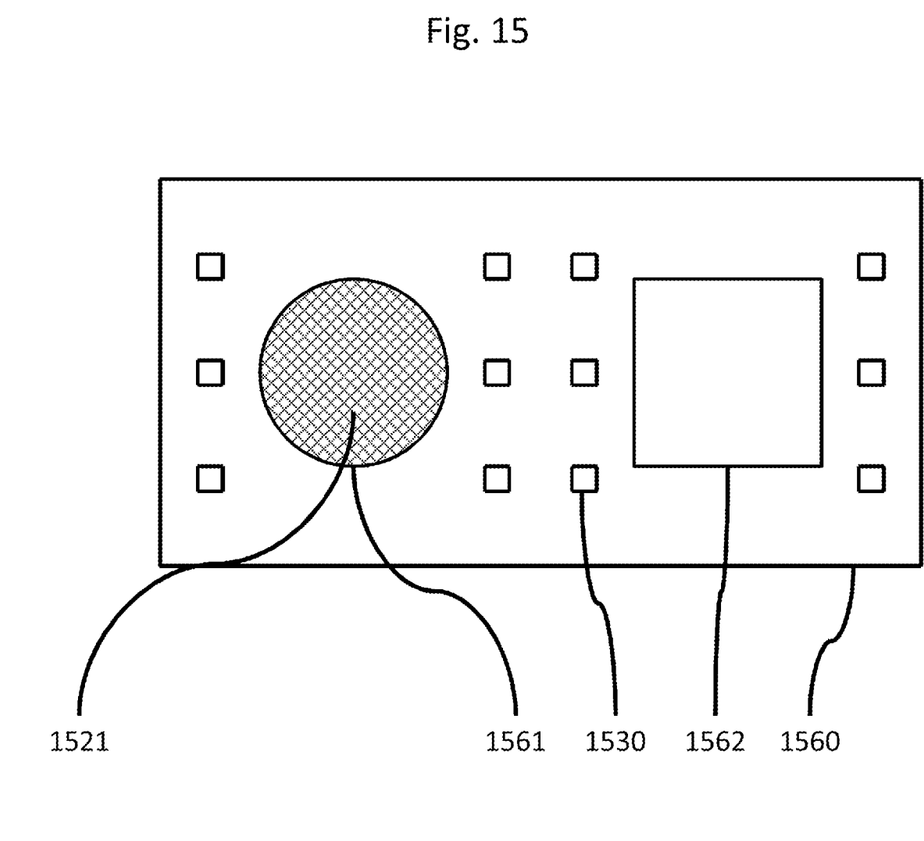
FIG. 15 shows a housing for an ultrasonic touch sensor.

As indicated in FIG. 15, troughs 1561 of a housing 1560 in which the semiconductor chips 1210, 1310 are arranged, as in FIGS. 12 and 13 for example, can have a round cross-section (cf. trough 1561) or a rectangular, in particular square cross-section (cf. trough 1562) and be surrounded by the electrical contact elements 1530. In examples, the acoustic coupling medium can be covered with a textile diaphragm 1521. The textile diaphragm can prevent the coupling medium from degrading in the time between the fabrication of the ultrasonic touch sensor and its attachment to the casing. In particular, the textile diaphragm 1521 can ensure that the coupling medium remains in the trough.

The coupling medium can be a B-Stage material in particular, and can only be fully cross-linked after the ultrasonic touch sensor has been attached to the casing. In particular, a B-Stage material can be a partially cured material, which is still flexible and wettable after an initial heat treatment and is only completely cured in the second curing step (e.g. during assembly or bonding to the casing).

Some exemplary embodiments are defined by the following examples:

Example 1. An ultrasonic touch sensor (800) for attaching to a casing having a semiconductor chip (810) which has one substrate side (811) and one component side (812), wherein the semiconductor chip (810) comprises at least one ultrasonic transducer element (813), wherein the ultrasonic transducer element (813) is arranged on the component side (812), having an acoustic coupling medium (820) covering the semiconductor chip (810) at least in the region of the ultrasonic transducer element (813), and having electrical contact elements (830) for controlling the ultrasonic transducer element (813), the electrical contact elements (813) being arranged on the component side (812) of the semiconductor chip (810).

Example 2. An ultrasonic touch sensor (800) according to example 1, wherein the acoustic coupling medium (820) comprises a gel.

Example 3. The ultrasonic touch sensor according to either of examples 1 or 2, wherein a textile diaphragm (1521) is attached to the side of the acoustic coupling medium facing away from the semiconductor chip.

Example 4. The ultrasonic touch sensor according to any one of the previous examples, wherein the acoustic coupling medium has an acoustic impedance of more than 0.6 MPa s/m.

Example 5. The ultrasonic touch sensor (1000) according to any one of the previous examples, wherein the ultrasonic touch sensor (1000), when attached to the casing (1050), is designed to detect contact with the casing (1050) on the side opposite the ultrasonic touch sensor (1000).

Example 6. The ultrasonic touch sensor (1200) according to any one of the previous examples, wherein the ultrasonic touch sensor (1200) comprises a pre-assembled housing (1260).

Example 7. The ultrasonic touch sensor (800) according to any one of the previous examples, wherein the contact elements (830) comprise solder balls.

Example 8. The ultrasonic touch sensor (1400) according to any one of the previous examples, wherein the semiconductor chip (1410) is potted in an encapsulation (1460).

Example 9. The ultrasonic touch sensor (1200) according to any one of the previous examples 6 to 8, wherein the semiconductor chip (1210) is located in a trough of the pre-assembled housing (1260).

Example 10. The ultrasonic touch sensor (1200) according to any one of the previous examples 6 to 9, wherein the housing (1260) has a higher stiffness than the acoustic coupling medium (1220).

Example 11. The ultrasonic touch sensor (1200) according to any one of the previous examples 6 to 9, wherein the housing (1260) has a lower stiffness than the acoustic coupling medium (1220).

Example 12. The ultrasonic touch sensor (1200) according to any one of the previous examples 9 to 11, wherein the trough is filled with the acoustic coupling medium (1220).

Example 13. The ultrasonic touch sensor (1100) according to any one of the previous examples, wherein the ultrasonic touch sensor (1100) has a flexible substrate (1160), wherein the acoustic coupling medium (1120) is arranged between the ultrasonic transducer element (1113) and the flexible substrate (1160).

Example 14. The ultrasonic touch sensor (1100) according to example 13, wherein the flexible substrate (1160) has conductor tracks (1161).

Example 15. The ultrasonic touch sensor (1100) according to either of the previous examples 13 or 14, wherein the flexible substrate (1160) has an adhesive layer on the side opposite the coupling medium (1120).

Example 16. The ultrasonic touch sensor (1300) according to any one of the previous examples, wherein the pre-assembled housing (1360) has an encapsulated conductor track (1361) for the electrical connection of the semiconductor chip (1310) to the contact element (1330).

Example 17. The ultrasonic touch sensor (1200) according to any one of the previous examples, wherein within the trough of the pre-assembled housing (1260), a conductor track (1261) is provided for the electrical connection of the semiconductor chip (1210) to the contact element (1230).

Example 18. The ultrasonic touch sensor (1400) according to any one of the previous examples, wherein the contact element is a spring pin (1430).

Example 19. The ultrasonic touch sensor according to any one of the previous examples, wherein the coupling medium comprises a B-Stage material.

Although specific exemplary embodiments have been illustrated and described in this description, persons with current knowledge of the art will recognize that a plurality of alternative and/or equivalent implementations can be chosen as a substitute for the specific exemplary embodiments shown and described in this description, without deviating from the scope of the invention disclosed. It is the intention that this application covers all adaptations or variations of the specific exemplary embodiments discussed here. It is therefore intended that this disclosure is limited only by the claims and their equivalents.

The invention claimed is:

1. An ultrasonic touch sensor for attaching to a casing, the ultrasonic touch sensor comprising:
a semiconductor chip which has a substrate side and a component side,
wherein the semiconductor chip comprises an ultrasonic transducer element that includes a first electrode, a second electrode, and a diaphragm configured to be stimulated by an alternating voltage applied between the first electrode and the second electrode, and
wherein the ultrasonic transducer element is arranged on the component side;
an acoustic coupling medium covering the component side of the semiconductor chip at least in a region of the ultrasonic transducer element; and electrical contact elements for controlling the ultrasonic transducer element via connections to the first electrode and the second electrode,
wherein the electrical contact elements are arranged on the component side of the semiconductor chip, and
wherein the acoustic coupling medium is arranged laterally between the electrical contact elements such that lateral sides of the electrical contact elements are in contact with the acoustic coupling medium.

2. The ultrasonic touch sensor as claimed in claim 1, wherein the acoustic coupling medium comprises a gel.

3. The ultrasonic touch sensor as claimed in claim 1, further comprising:
a textile diaphragm attached to a side of the acoustic coupling medium facing away from the semiconductor chip.

4. The ultrasonic touch sensor as claimed in claim 1, wherein the acoustic coupling medium has an acoustic impedance of more than 0.6 MPa s/m.

5. The ultrasonic touch sensor as claimed in claim 1, wherein the ultrasonic touch sensor, when attached to the casing, is configured to detect contact with the casing on a side of the casing arranged opposite to the ultrasonic touch sensor.

6. The ultrasonic touch sensor as claimed in claim 1, wherein the ultrasonic touch sensor comprises a pre-assembled housing.

7. The ultrasonic touch sensor as claimed in claim 6, wherein the semiconductor chip is arranged in a trough of the pre-assembled housing.

8. The ultrasonic touch sensor as claimed in claim 7, wherein the pre-assembled housing has a higher stiffness than the acoustic coupling medium.

9. The ultrasonic touch sensor as claimed in claim 7, wherein the pre-assembled housing has a lower stiffness than the acoustic coupling medium.

10. The ultrasonic touch sensor as claimed in claim 7, wherein the trough is filled with the acoustic coupling medium.

11. The ultrasonic touch sensor as claimed in claim 7, wherein within the trough of the pre-assembled housing, conductor tracks are provided for electrical connection of the semiconductor chip to the electrical contact elements.

12. The ultrasonic touch sensor as claimed in claim 6, wherein the pre-assembled housing has encapsulated conductor tracks for electrical connection of the semiconductor chip to the electrical contact elements.

13. The ultrasonic touch sensor as claimed in claim 1, wherein the electrical contact elements comprise solder balls.

14. The ultrasonic touch sensor as claimed in claim 1, wherein the semiconductor chip is potted in an encapsulation.

15. The ultrasonic touch sensor as claimed in claim 1, further comprising:
a flexible substrate,
wherein the acoustic coupling medium is arranged between the ultrasonic transducer element and the flexible substrate.

16. The ultrasonic touch sensor as claimed in claim 15, wherein the flexible substrate has conductor tracks.

17. The ultrasonic touch sensor as claimed in claim 15, wherein the flexible substrate has an adhesive layer on a side opposite the acoustic coupling medium.

18. The ultrasonic touch sensor as claimed in claim 1, wherein at least one of the electrical contact elements is a spring pin.

19. The ultrasonic touch sensor as claimed in claim 1, wherein the acoustic coupling medium comprises a B-Stage material.

20. The ultrasonic touch sensor as claimed in claim 1, wherein the acoustic coupling medium is directly coupled to the ultrasonic transducer element.

21. The ultrasonic touch sensor as claimed in claim 1, wherein the electrical contact elements are partially encapsulated by the acoustic coupling medium.

22. The ultrasonic touch sensor as claimed in claim 21, wherein the electrical contact elements protrude from the acoustic coupling medium for making electrical contact with one or more conductor tracks coupled to the casing.

23. The ultrasonic touch sensor as claimed in claim 1, wherein the acoustic coupling medium fills areas laterally between the electrical contact elements.

24. The ultrasonic touch sensor as claimed in claim 23, wherein the electrical contact elements protrude from the acoustic coupling medium for making electrical contact with one or more conductor tracks coupled to the casing.

25. The ultrasonic touch sensor as claimed in claim 24, wherein the electrical contact elements comprise solder balls.

26. The ultrasonic touch sensor as claimed in claim 1, wherein the diaphragm includes the first electrode.

* * * * *